United States Patent [19]

Sartore

[11] Patent Number: 5,414,265
[45] Date of Patent: May 9, 1995

[54] LINE-WIDTH MEASUREMENTS OF METALLIZATION COATED WITH INSULATOR ON MICROELECTRONIC CIRCUITS USING ENERGY DISPERSIVE X-RAY ANALYSIS

[75] Inventor: Richard G. Sartore, Bradley Beach, N.J.

[73] Assignee: The United States of America as represented by the Secretary of the Army, Washington, D.C.

[21] Appl. No.: 118,533

[22] Filed: Sep. 9, 1993

[51] Int. Cl.6 .............................................. H01J 37/28
[52] U.S. Cl. ..................................... 250/310; 250/397; 250/399
[58] Field of Search ...................... 250/310, 397, 492.2, 250/399

[56] References Cited

U.S. PATENT DOCUMENTS 4,751,384  6/1988  Murakoshi et al. ................. 250/397

Primary Examiner—Bruce C. Anderson
Attorney, Agent, or Firm—Michael Zelenka; William H. Anderson

[57] ABSTRACT

A semiconductor device conductive line width non-destructive measuring system comprises an electron beam source of sufficient energy to penetrate the passivation coating over conductive line traces and means for scanning the electron beam across the surface. An x-ray monitor to monitor x-rays produced in the conductive traces by the scanning electron beam produces an accurate measurement of the line width and spacing of the conductive traces.

9 Claims, 5 Drawing Sheets

LINE-WIDTH MEASUREMENTS OF METALLIZATION COATED WITH INSULATOR ON MICROELECTRONIC CIRCUITS USING ENERGY DISPERSIVE X-RAY ANALYSIS

GOVERNMENT INTEREST

The invention described herein may be manufactured, used, and licensed by or for the Government for governmental purposes without the payment to me or us of any royalty thereon.

FIELD OF THE INVENTION

This invention relates to the measurement of conductive line width for semiconductor devices, employing a scanning electron beam which produces characteristic x-rays from the conductive lines beneath an insulation coating, and an x-ray monitor.

BACKGROUND OF THE INVENTION

The evaluation of quality and conformance to target production specifications for microelectronic devices frequently requires measurements of the feature sizes of the critical conductive elements for the circuits. Further, failure analysis dictates critical dimension measurements to trace the cause of failure of a device. Present commercial critical dimension measurement systems are based on secondary electron imaging techniques and analysis. Thus, in a failure analysis or quality evaluation laboratory, the microelectronic circuits examined are usually fully fabricated, with passivation and insulator layers in place. Critical dimension measurement systems based on secondary electron emission will not give accurate results unless the top insulating layer is removed. Layer removal is a destructive process and also is difficult to carry out for devices that have several metallization levels. To address the destructive analysis and layer removal problems, a novel measurement technique has been developed that uses energy dispersive x-ray analysis to measure critical feature sizes under an insulating layer.

BRIEF SUMMARY OF THE INVENTION

In accordance with the present invention, an electron beam having sufficient energy to penetrate the insulation or passivation coating of a semiconductor device substrate reaches and excites the underlying conductor lines to produce characteristic x-rays from the conductive lines. The electron beam is scanned transversely across the conductive lines and the x-rays produced are correlated with the electron beam scan position to produce an accurate measurement of the line width and spacing.

The electron beam energy may be adjusted to produce a smaller beam diameter and thus increase the measurement accuracy.

The accuracy of measurement by secondary electron emission from the conductive lines is, for example, plus or minus 1 micron when coated with a glassivation layer. With the present invention, accuracy is to a small fraction of a micron, and correlates closely to visual measurements on uncoated metal.

DETAILED DESCRIPTION

Figure 1:
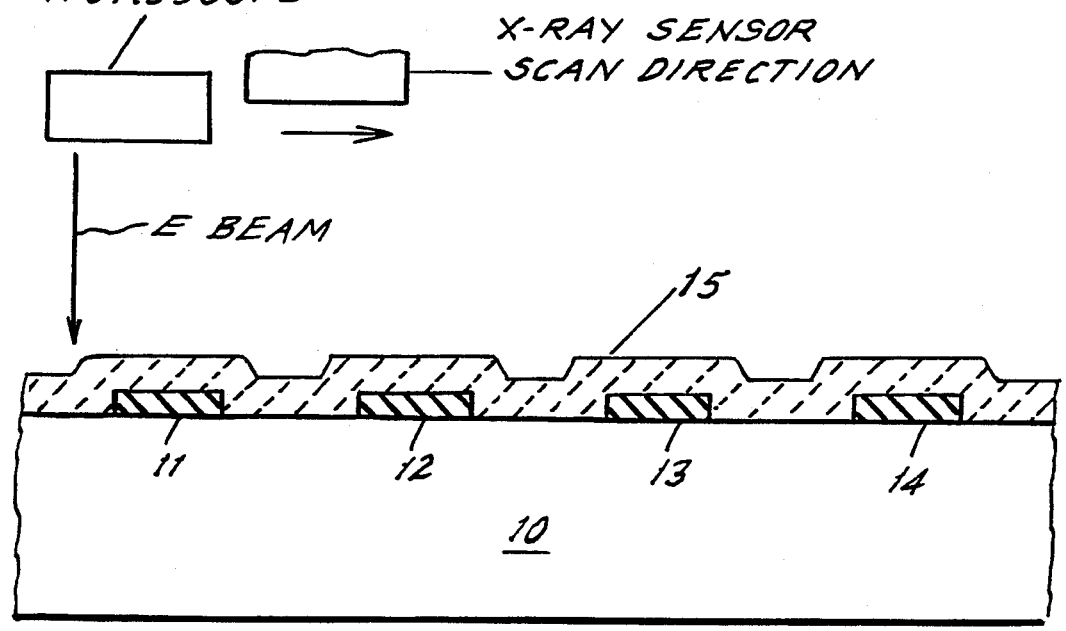
FIG. 1 is a cross-section of a small section of a semiconductor substrate having spaced conductive traces on a silicon substrate.
Figure 1A:
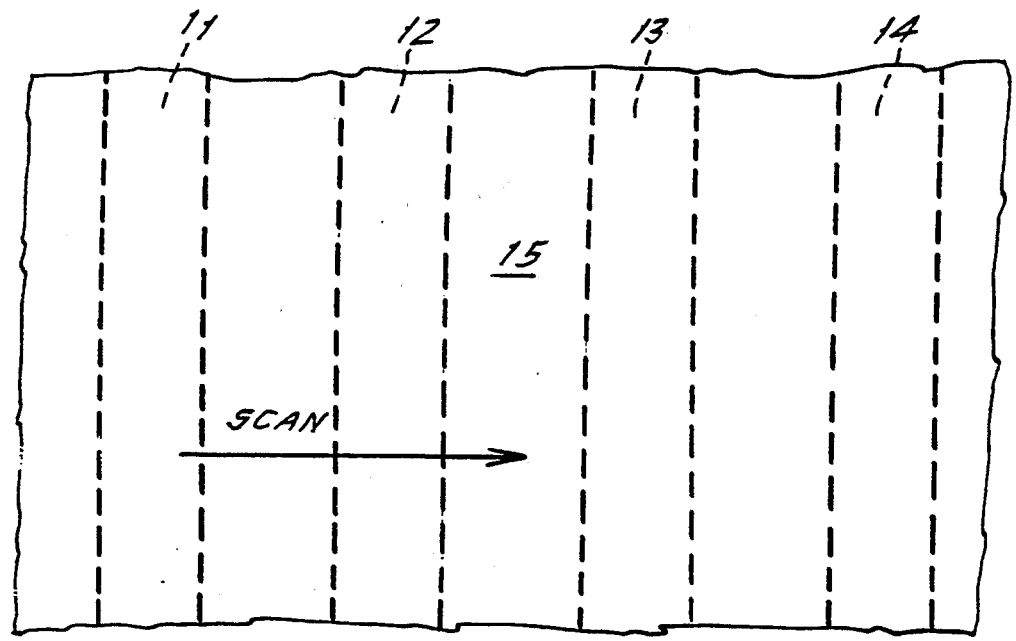
FIG. 1a is a top view of the substrate of FIG. 1.
Figure 2:
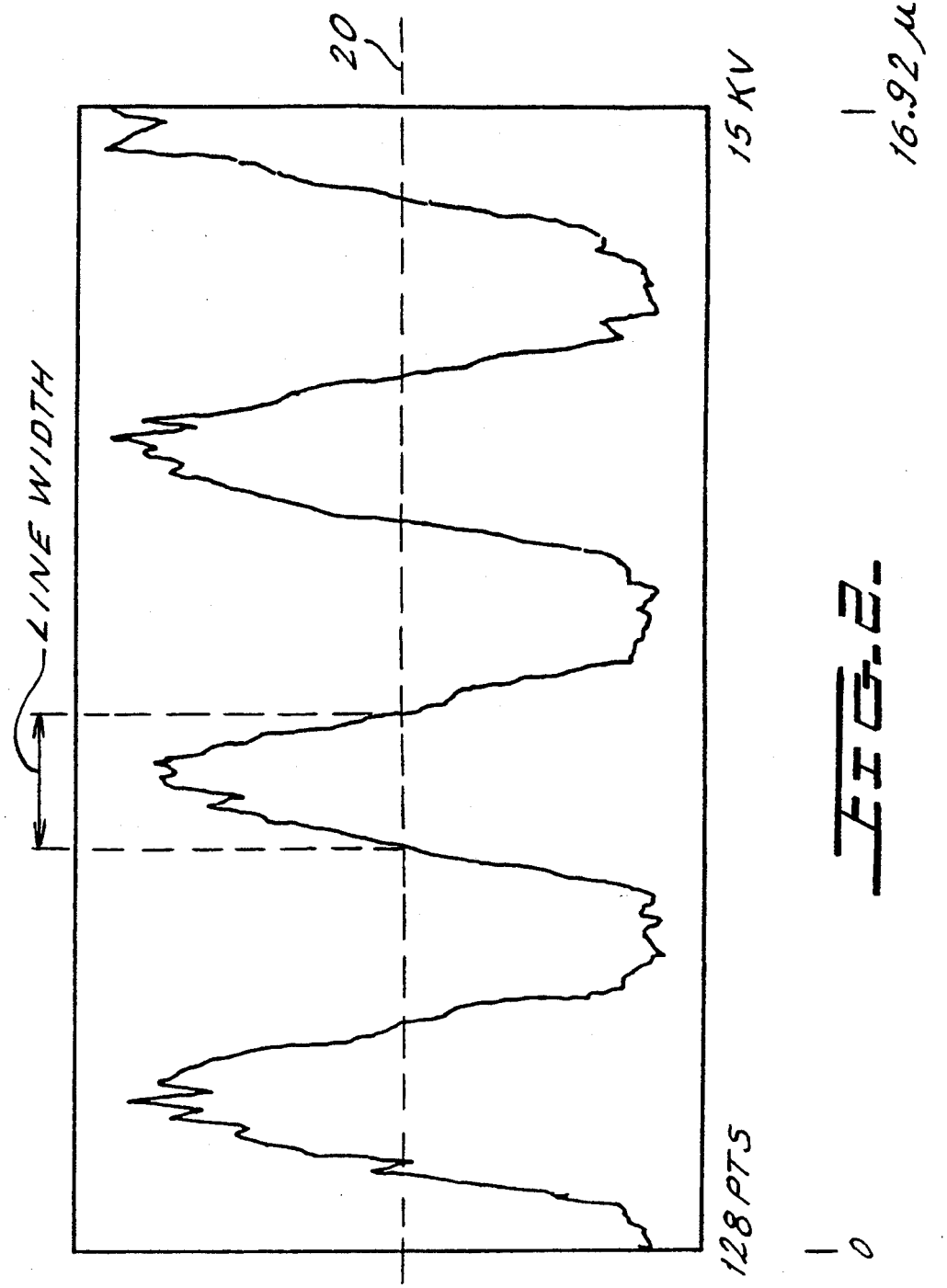
FIG. 2 is a plot showing the x-ray count when sweeping a semiconductor substrate with an electron beam of energy 15 KV and an x-ray measurement of 128 points across the sweep.

Referring first to FIGS. 1 and 2, there is shown therein a silicon substrate 10, having conductive lines 11, 12, 13 and 14 thereon. The conductive lines are covered by an insulation coating 15, for example a coating of silicon dioxide having a thickness, for example, of 1500 Angstroms. The conductive lines may be aluminum, although other conductive lines, for example, polysilicon highly doped with phosphorus, or the like can be used. The silicon may contain any variety of P/N junctions, not shown, to produce any desired device such as a microprocessor, or memory or the like.

The manufacture of such devices frequently requires measurement means for measuring the line width of the metal or conductive lines 11 to 14 and/or their spacing. Commercially available equipment employ an electron beam of sufficient energy to produce secondary electrons from the metal lines, coated with passivation, which are measured and correlated to the scan of the electron beam to produce a line width. Such measurements, however, are accurate only to about plus or minus one micron, when coated with a passivation layer. Where greater accuracy is needed, the passivation layer must be stripped away, and a visual measurement made. This is a destructive and time-consuming test.

In accordance with the invention, an electron beam of sufficient energy to penetrate the passivation layer 15 and generate characteristic x-rays from the conductive lines is used. The electron beam is produced by a conventional, commercially available scanning electron microscope, identified in FIG. 1. The x-ray sensor, or monitor, is also a standard, commercially available x-ray monitor, also identified in FIG. 1. Thus, where the conductive lines are aluminum, the electron beam penetrating the passivation layer will generate x-rays of a Ka aluminum line and are thus distinguishable from x-rays produced by the silicon substrate.

As the electron beam is scanned in the direction shown in FIGS. 1 and 2, the output x-ray count of the x-ray monitor is coordinated by conventional techniques to the electron beam position to produce an output curve of the shape shown in FIGS. 2, 3, 4 or 5 which contains information related to the conductive line width and spacing.

Thus, in FIG. 2, the electronics system (not shown) is arranged to make x-ray counts at 128 points over a period of one full sweep (of the lines shown). The electron beam energy is 15 KV in FIG. 2 and the resulting plot produces an accurate measurement (across a line 20 at half the height of the trace—FWHM) of line width and line spacing. Table 1, which follows, shows the line widths of lines 11, 12, 13 and 14: (a) when measured visually on an uncoated wafer, (b) when measured by conventional secondary electron emission techniques (termed "screen coated"), and (c) by the x-ray techniques of the present invention.

TABLE 1

|  | Line 11 | Line 12 | Line 13 | Line 14 | AVG | STD |
|---|---|---|---|---|---|---|
| Uncoated | 1.71 | 1.65 | 1.65 | 1.52 | 1.633 | 0.069 |
| Screen Coated | 2.49 | 2.499 | 2.469 | 2.468 | 2.481 | 0.067 |
| X-ray | 1.541 | 1.666 | 1.666 | 1.63 | 1.625 | 0.061 |

It will be noted from Table 1 above that the x-ray measurement of the coated substrate correlates closely with the visual measurement of an uncoated wafer.

Figure 3:
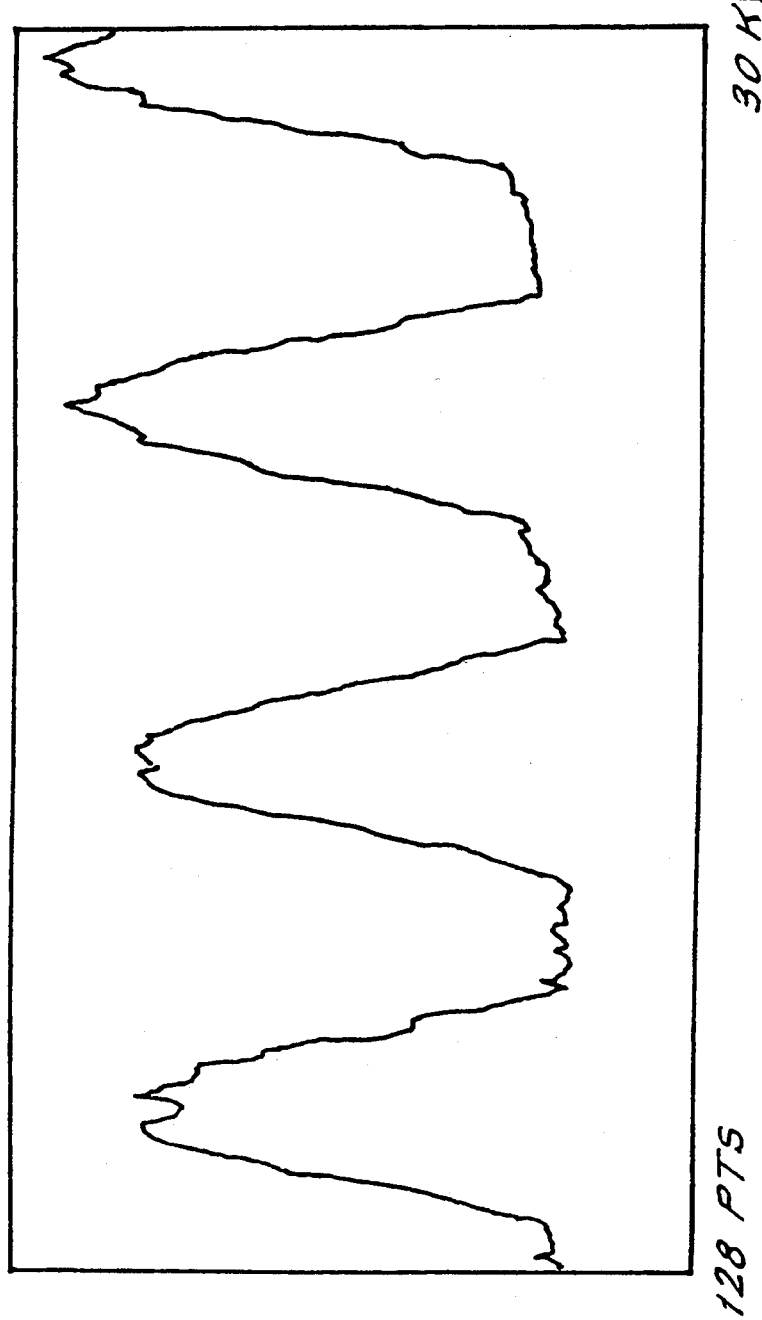
FIG. 3 is a plot similar to that of FIG. 2 using an energy of 30 KV for the electron beam.
Figure 4:
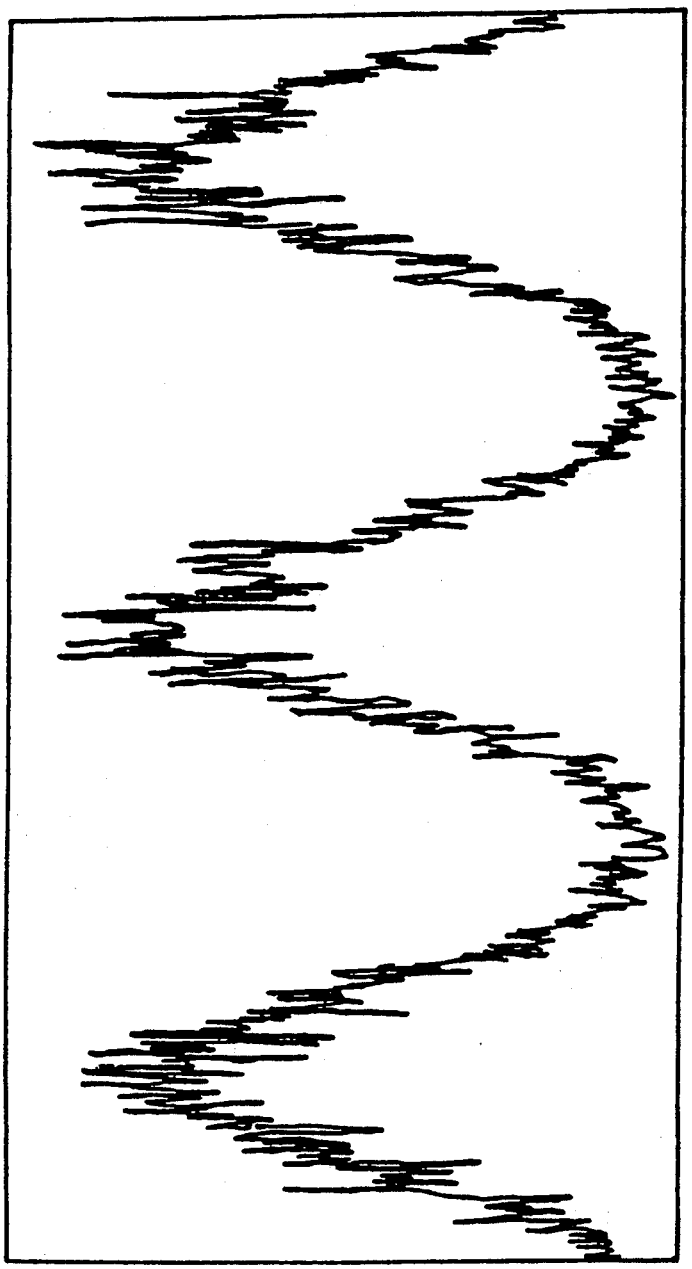
FIG. 4 is a plot like that of FIG. 2, using 1028 measuring points for the x-rays monitored.
Figure 5:
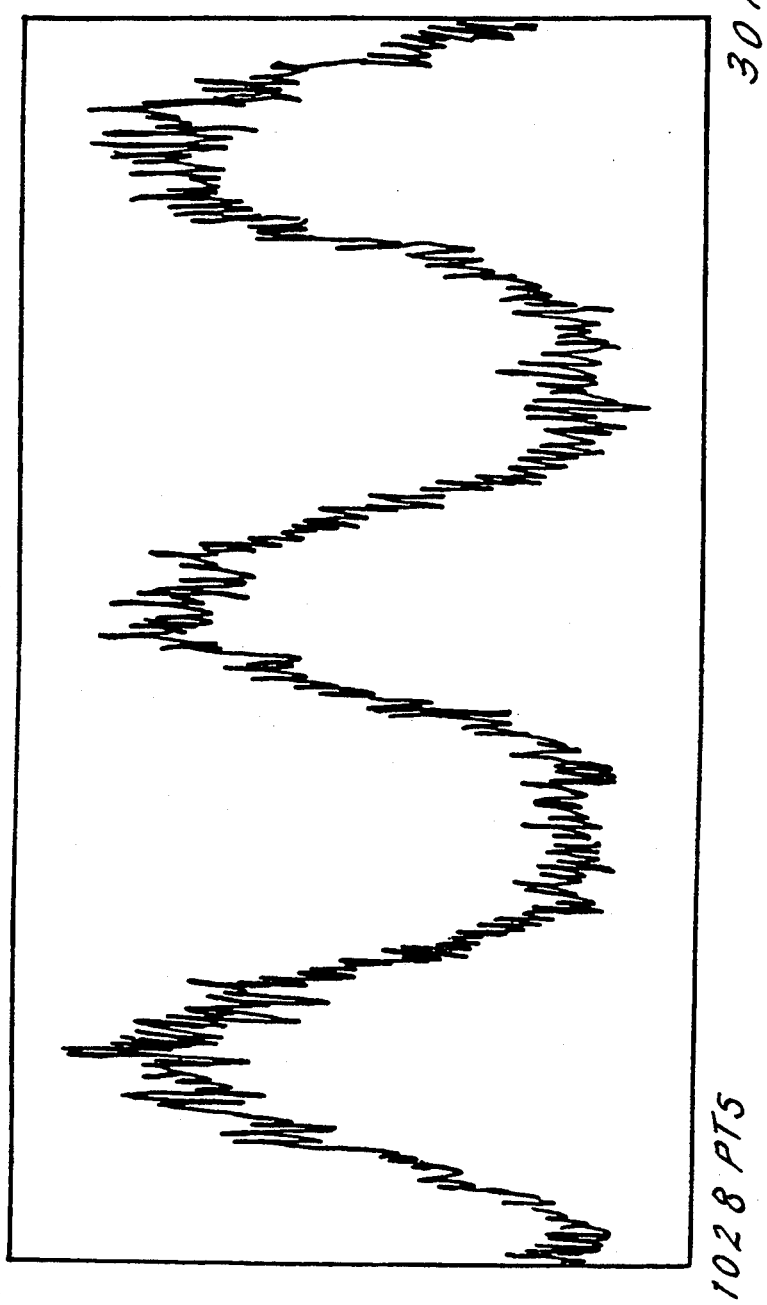
FIG. 5 is a plot like that of FIG. 4, using an electron energy of 30 KV.

It has been found that a higher electron energy, for example 30 KV, will produce a more accurate or better defined x-ray trace, as shown in FIG. 3. It has been shown by the inventor that the higher electron beam energy produces a smaller electron beam cross-section, thus producing improved measurement results.

It is also possible to increase measurement accuracy by increasing the number of points for x-ray counts per scan length. Thus, in FIG. 4, 1028 points per unit scan length was used to increase measurement accuracy. The accuracy with 1028 points was even further increased at the higher energy of 30 KV, shown in FIG. 5. Extraction of measurements may require the same signal processing to reduce noise levels to tolerable levels for measurements.

It will be understood that the novel measurement technique of the invention has the following advantages:

1. Ease of use in measurement of line width, using commercially available instrumentation.
2. No need to remove the insulation coating on line widths to be measured.
3. Non destructive physical analysis of fabricated devices.
4. Comparable or improved accuracy and precision to commercial critical dimension measurement systems.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for measuring the width of a line of a conductive material disposed on a surface of a body of a substrate material, the conductive and substrate materials coated with an insulation material; the conductive, substrate and insulation materials each having different respective x-ray radiation outputs in response to input electron irradiation; the method comprising the steps of irradiating the surface of the body and the line of the conductive material with a beam of electrons of sufficient energy to penetrate the insulation material and to interact with at least the conductive material to cause the conductive material to produce its x-ray radiation output; scanning the beam of electrons across the full width of the line of conductive material and monitoring the x-ray radiation output of the line in synchronism with the scanning of the beam to determine the width of the line.

2. The method of claim 1 wherein the conductive material is a metal; the substrate material is silicon and insulation material at least includes silicon dioxide.

3. The method of claim 1 wherein a plurality of lines of the conductive material are disposed on the surface of the substrate material and are covered by the insulation layer; said scanning beam being scanned across each of said lines.

4. The method of claim 3 wherein the conductive material is a metal; the substrate material is silicon and insulation material at least includes silicon dioxide.

5. The method of measuring the width of an aluminum line on a silicon substrate surface, covered with a silicon dioxide passivating layer, without removing said silicon dioxide layer; said method comprising the scanning of an electron beam across the surface of said silicon substrate and across said line, with a sufficiently high energy to penetrate said silicon dioxide layer and to interact with said aluminum line to generate x-rays characteristic of said aluminum lines, and measuring the production of said x-rays across said surface to determine the width of said x-ray generating line.

6. The method of claim 5 wherein said electron beam has an energy in excess of about 15 KV.

7. The method of claim 5 in which a plurality of spaced aluminum lines are formed on said substrate and wherein said scanning beam scans across each line.

8. The method of claim 7 wherein said electron beam has an energy in excess of about 15 KV.

9. Apparatus for measuring the line width of at least one line of conductive material on a silicon substrate surface comprising, in combination: support means for supporting said substrate, electron beam generating means for generating and scanning an electron beam across the surface of said substrate and across said conductive line on said substrate; said electron beam generating means generating electrons with sufficient energy to penetrate any passivation coating on said substrate and to excite x-ray radiation from said line of conductive material; x-ray monitor means for monitoring the x-rays emitted from said line of conductive material during an electron beam scan; and analyzing means connected to said x-ray monitor means to produce a measure of the width of said line.

* * * * *